United States Patent [19]
Collins et al.

[11] Patent Number: 5,514,979
[45] Date of Patent: May 7, 1996

[54] METHODS AND APPARATUS FOR DYNAMICALLY REDUCING RINGING OF DRIVER OUTPUT SIGNAL

[75] Inventors: David F. Collins, St. Peters; Brian C. Lacey, Glen Mills, both of Pa.

[73] Assignee: Unisys Corporation, Blue Bell, Pa.

[21] Appl. No.: 345,307

[22] Filed: Nov. 28, 1994

[51] Int. Cl.⁶ .................................................. H03K 17/16
[52] U.S. Cl. ........................... 326/27; 326/30; 327/180
[58] Field of Search .......................... 326/27, 30; 327/180

[56]        References Cited

U.S. PATENT DOCUMENTS

| | | | |
|---|---|---|---|
| 4,451,745 | 5/1984 | Itoh et al. | 307/475 |
| 4,806,794 | 2/1989 | Walters, Jr. | 307/451 |
| 4,877,980 | 10/1989 | Kubinec | 307/542 |
| 4,987,318 | 1/1991 | Burke et al. | 326/30 |
| 5,023,488 | 6/1991 | Gunning | 307/475 |
| 5,073,726 | 12/1991 | Kato et al. | 307/443 |
| 5,073,727 | 12/1991 | Shizu | 307/451 |
| 5,103,118 | 4/1992 | Peterson | 307/443 |
| 5,121,284 | 6/1992 | Onodera et al. | 361/152 |
| 5,144,163 | 9/1992 | Matsuzawa et al. | 307/446 |
| 5,179,298 | 1/1993 | Hirano et al. | 307/443 |
| 5,179,299 | 1/1993 | Tipon | 307/443 |
| 5,204,558 | 4/1993 | Kumaki et al. | 326/27 |
| 5,216,300 | 6/1993 | Wabuka | 326/27 |
| 5,311,081 | 5/1994 | Donaldson et al. | 307/475 |
| 5,321,319 | 6/1994 | Mahmood | 307/443 |
| 5,329,175 | 7/1994 | Peterson | 307/443 |
| 5,329,185 | 7/1994 | Cooperman et al. | 307/475 |
| 5,408,146 | 4/1995 | Nguyen et al. | 326/30 X |

*Primary Examiner*—David R. Hudspeth
*Attorney, Agent, or Firm*—Woodcock Washburn Kurtz Mackiewicz & Norris

[57]        ABSTRACT

Disclosed is a bus driver circuit that dynamically clamps the bus voltage for a predetermined period following a transition of the bus voltage, thereby reducing overshoot and ringing. The disclosed circuit dynamically clamps the initial overshoot at approximately the bus terminating voltage VT. The clamping is dynamic in that it is active for only a limited, prescribed period, which is adjustable. In a preferred embodiment, a driver receives an input signal (VIN) and provides an OUTPUT signal to a bus terminated with a terminating voltage (VT). A clamp circuit receives a CLAMP GATE signal and sinks current from the OUTPUT signal, thus reducing ringing and overshoot of the output signal. A delay circuit disables the clamp after a prescribed delay following a transition of the OUTPUT signal.

20 Claims, 10 Drawing Sheets

METHODS AND APPARATUS FOR DYNAMICALLY REDUCING RINGING OF DRIVER OUTPUT SIGNAL

FIELD OF THE INVENTION

The present invention relates generally to bus driver circuits and more particularly to a bus drive circuit having a dynamic clamp for reducing overshoot of the output signal provided to the bus.

BACKGROUND OF THE INVENTION

Figure 1A:
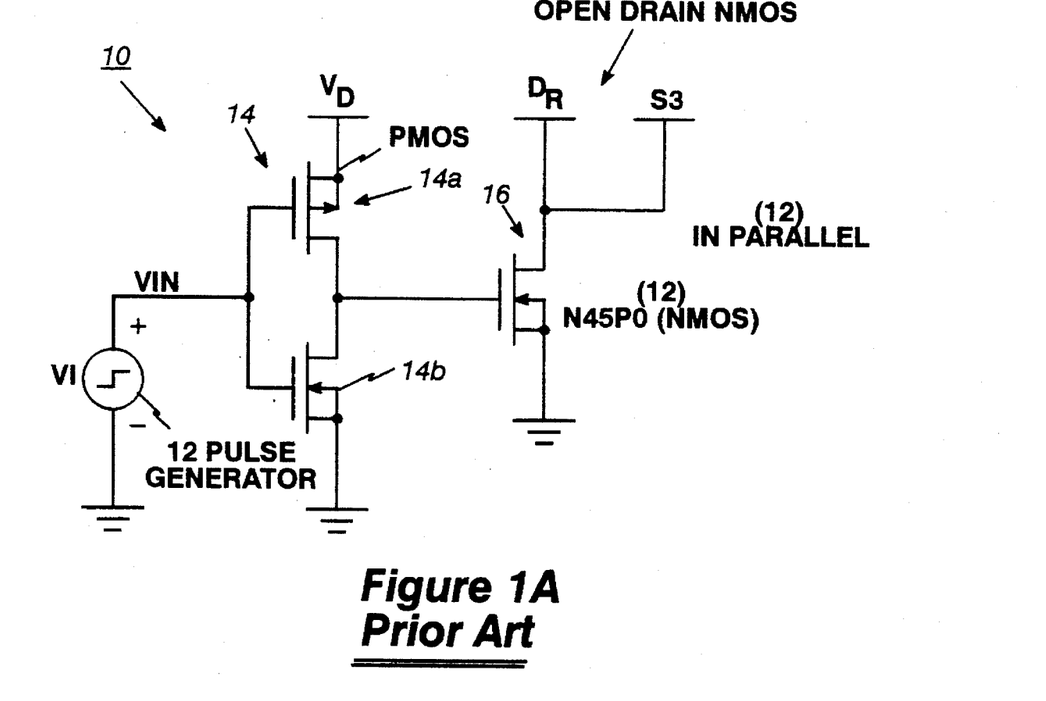
FIG. 1A schematically depicts a prior art open drain bus driver.
Figure 1B:
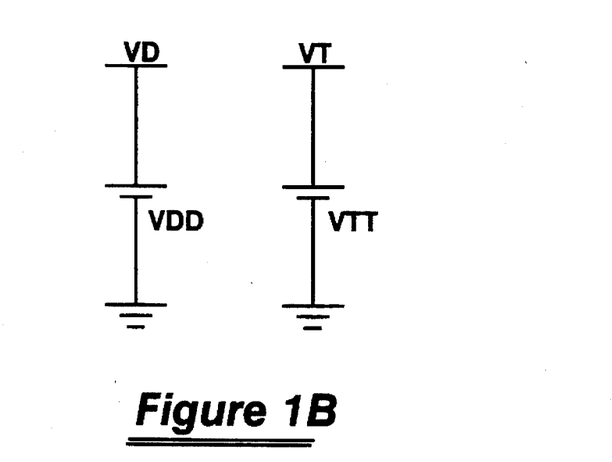
FIG. 1B depicts the symbols used to represent power supply voltages VD and VT and corresponding power supplies VDD and VTT.

Referring to FIGS. 1A and 1B, a typical CMOS open drain bus driver 10 includes a pulse source 12 and a pre-driver stage 14 comprising a PMOS device 14a and an NMOS device 14b, with the PMOS device 14a having a tie point (labeled "VD") coupled to a power supply VDD. As shown in FIG. 1B, the power supplies VDD and VTT provide voltages of VD and VT, respectively. In addition, the driver 10 includes a driver stage 16 comprising a plurality (twelve (12) in this example) of NMOS devices 16 coupled in parallel to one another and having open drains, as indicated by the open tie points labelled "DR." These drains are shown in FIG. 1A as being connected to a slot S3 but, of course, the driver 10 could be connected to any of the slots S1–S5.

Figure 1C:
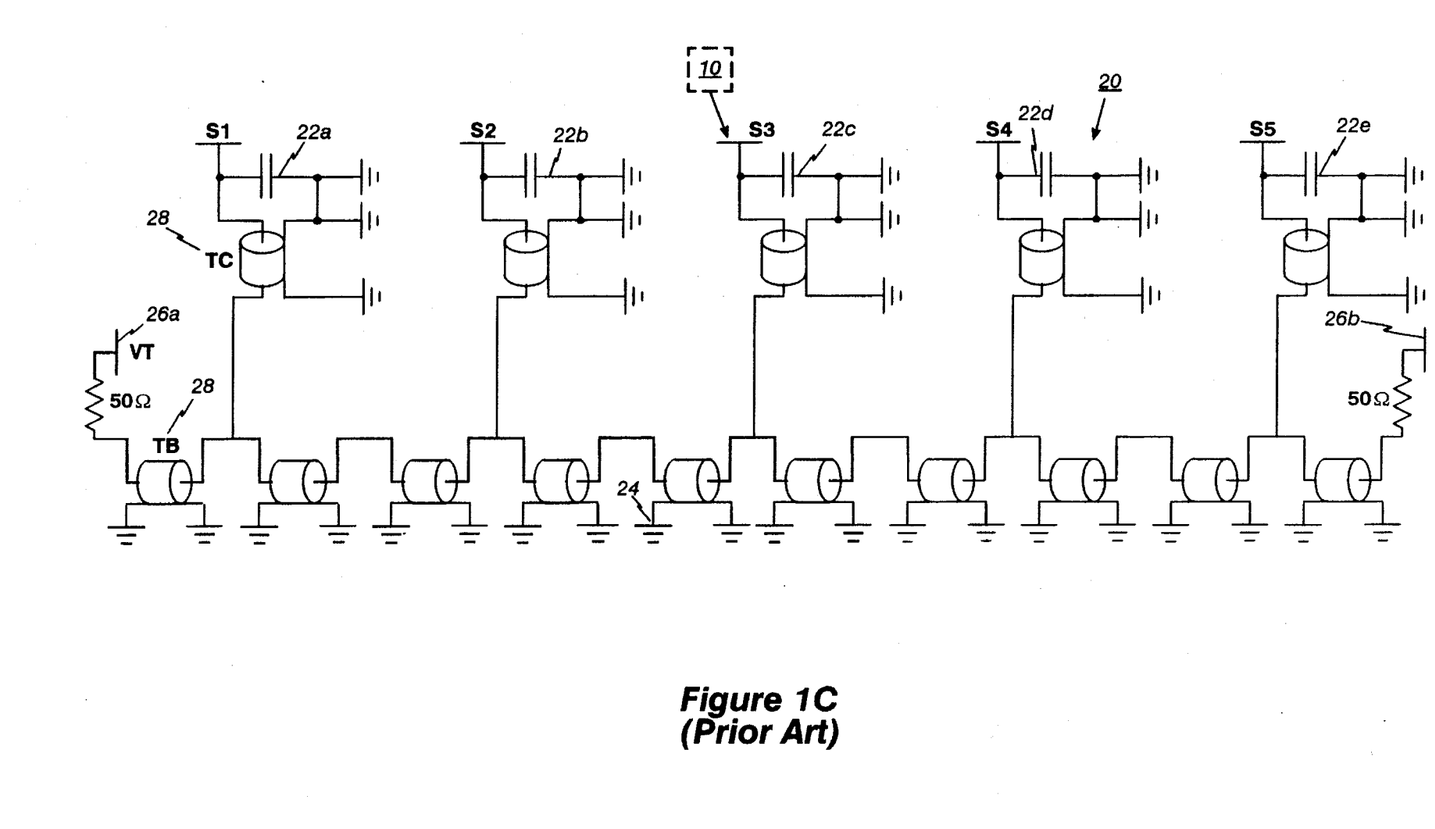
FIG. 1C schematically depicts a bus of the type driven by the prior art bus driver and a bus driver in accordance with the present invention.

Referring to FIG. 1C, a bus 20 comprises a plurality of slots S1–S5 each of which may be coupled to a receiver. In FIG. 1C, the receivers are represented by capacitors 22a–22e, respectively. The bus driver 10 of FIG. 1A is shown as being connected to slot S3. In addition, the bus 20 includes transmission line segments TB having inputs and outputs which are referenced to a ground plane 24. It is well known in the art that such transmission line segments can be embodied as conductive lines printed on a substrate. The bus 20 also includes parallel stubs, which are transmission line segments TC having respective inputs and outputs connected to a ground plane. The transmission line segments TB and TC are represented generally by reference numeral 28. The two ends of the bus 20 are terminated with 50Ω resistors, which are in turn tied to power supply terminating voltage VT at tie points 26a and 26b, respectively.

Figure 2:
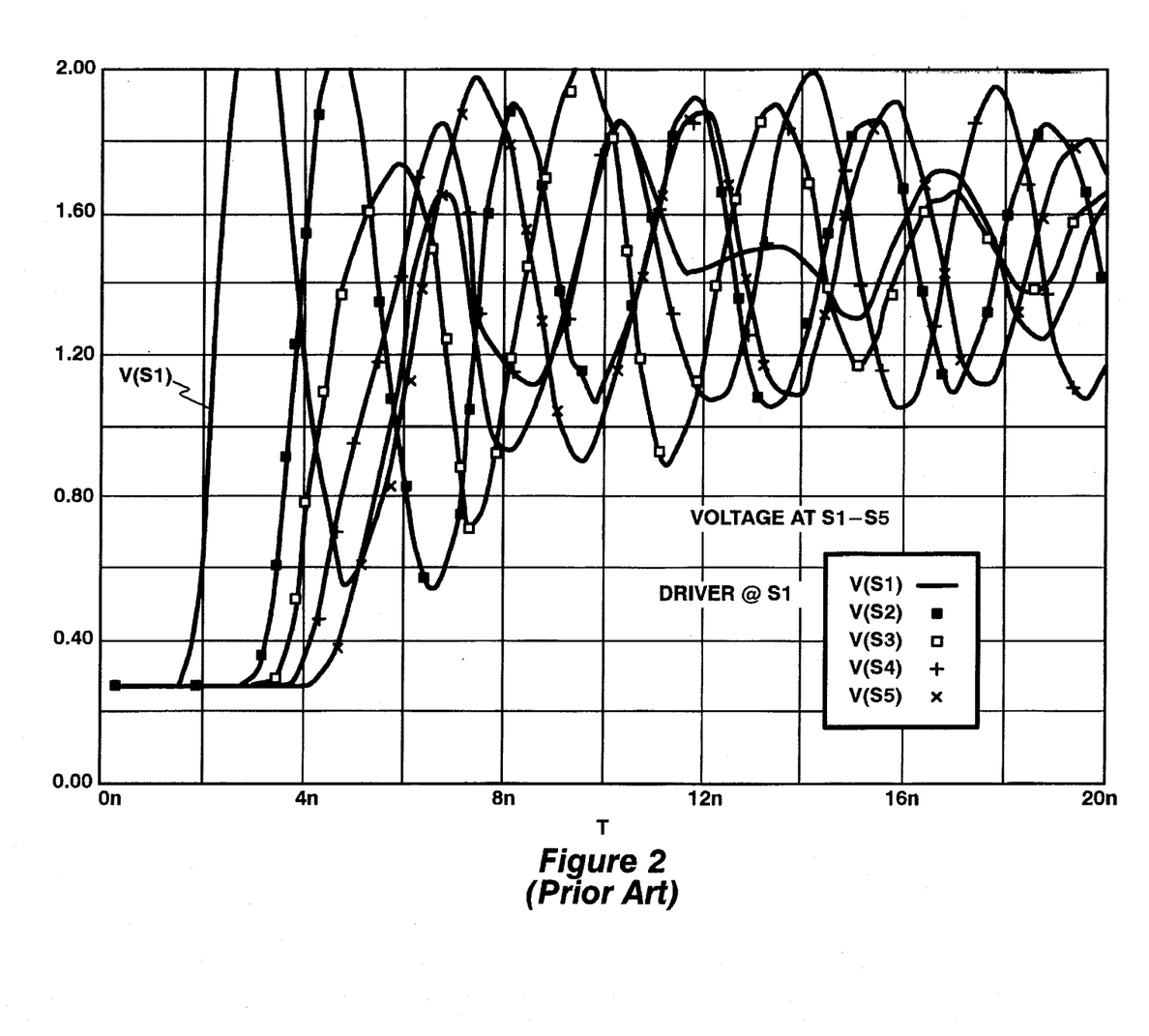
FIG. 2 depicts voltage waveforms at bus slots S1–S5 (FIG. 1C) with the prior art bus driver 10 of FIG. 1A connected at slot S1.
Figure 3:
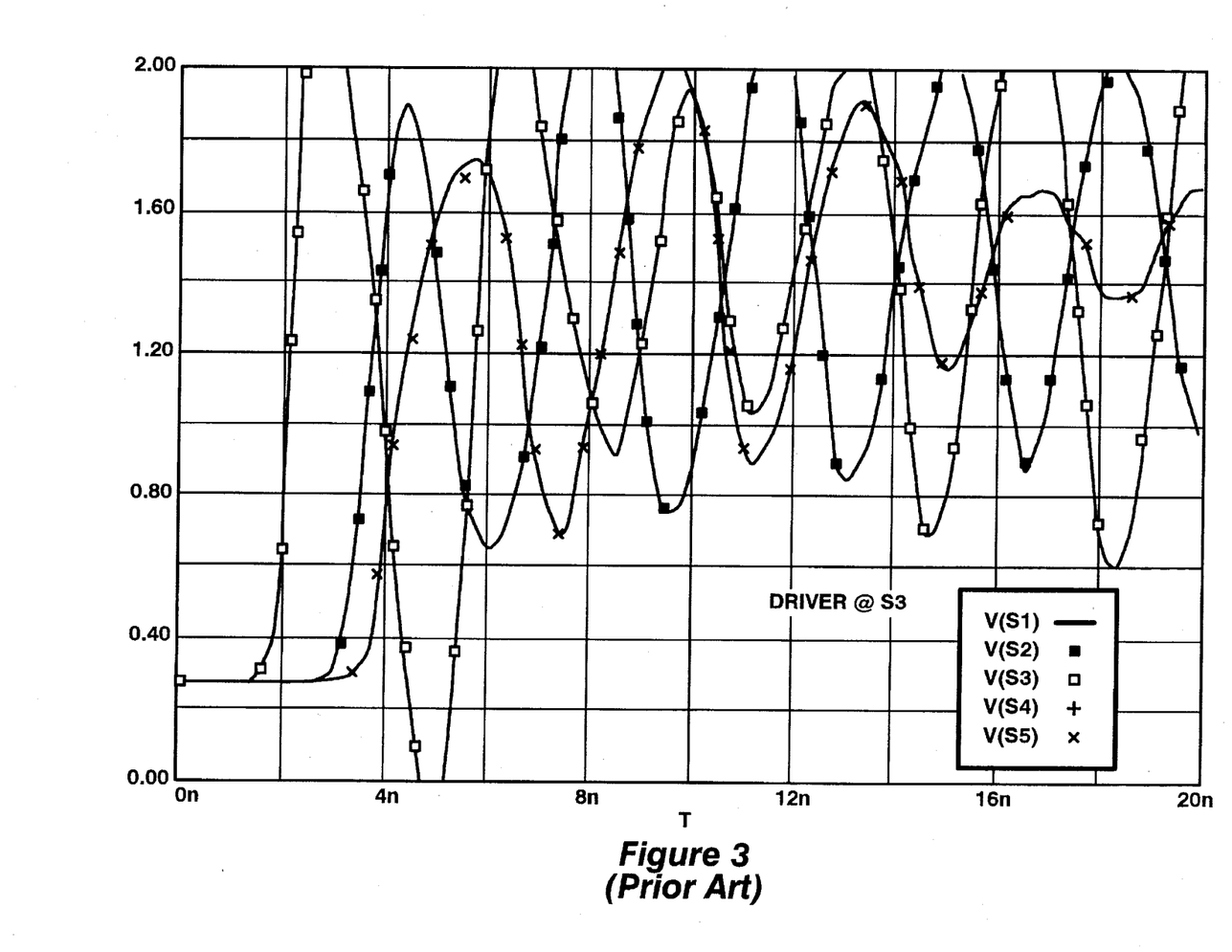
FIG. 3 depicts voltage waveforms at slots S1–S5 with the prior art bus driver 10 at slot S3.

State of the art CMOS open drain bus drivers of the type depicted in FIG. 1A produce excessive ringing due to the large di/dt (i.e., large rate of change of current with respect to time) that occurs when the twelve (12) N45P0 NMOS devices 16 are turned off. This excessive ringing is shown in FIGS. 2 and 3, which depict the voltage waveforms at slots S1–S5 of the bus 20 of FIG. 1C. FIG. 2 shows the waveforms when the driver 10 (FIG. 1A) is coupled to slot S1, and FIG. 3 depicts the waveforms when the driver is coupled to slot S3. This di/dt, which is typically in the range of 150 mA/nS, and the inductance L associated with the transmission line network cause a gross overshoot of the line terminating voltage, VTT=1.5 V, due to the inductive voltage L di/dt. The initial edge of the overshoot is subsequently propagated down the bus while undergoing reflections, thus producing excessive ringing at the receivers coupled to slots S1–S5.

The waveforms depicted in FIGS. 2 and 3 were generated by a computer simulation using a model of the driver 10 and bus 20. In the model, the receivers or capacitances 22a–22e were represented by 8 pF capacitors. The characteristic impedance of the transmission line segments 28 was set to 50Ω. The power supplies VDD and VTT were set to 3.3 V and 1.5 V, respectively. The length of the transmission lines TB and TC were represented as time delays of 0.2 nS and 0.4 nS, respectively. The waveforms of FIGS. 2 and 3 demonstrate the severe voltage overshoot (above the 1.5 V terminating voltage) and ringing that occur when the driver 10 is turned off. A primary goal of the present invention is to provide a bus driver having means for reducing the severity of the ringing exhibited by these waveforms.

U.S. Pat. No. 5,179,299, Jan. 12, 1993, titled "CMOS Low Output Voltage Bus Driver," discloses a digital computer data transfer system including a bus driver that purportedly reduces data bus voltage swings between logic HIGH and logic LOW levels by defining minimum and maximum bus voltages which lie between the logic HIGH and LOW levels, thus lowering bus transition times. Positive and negative overshoot of the reduced bus logic levels are prevented by "clamping diode" transistors. The system disclosed by this patent is believed to have the following disadvantages: (a) the chip in which it is implemented requires an additional supply voltage (VHO=1.0 V), which then requires additional package pins; (b) the driver dissipates power in both the High and Low states, and in both states NMOS 228 and 242 are ON; and (c) when the driver is disabled (DISABLE=5 V) and another driver on the bus is not disabled and driving a High, the NMOS 242 in the disabled driver will conduct; likewise, when driving a Low, the NMOS 228 in the disabled driver will conduct.

SUMMARY OF THE INVENTION

Figure 5:
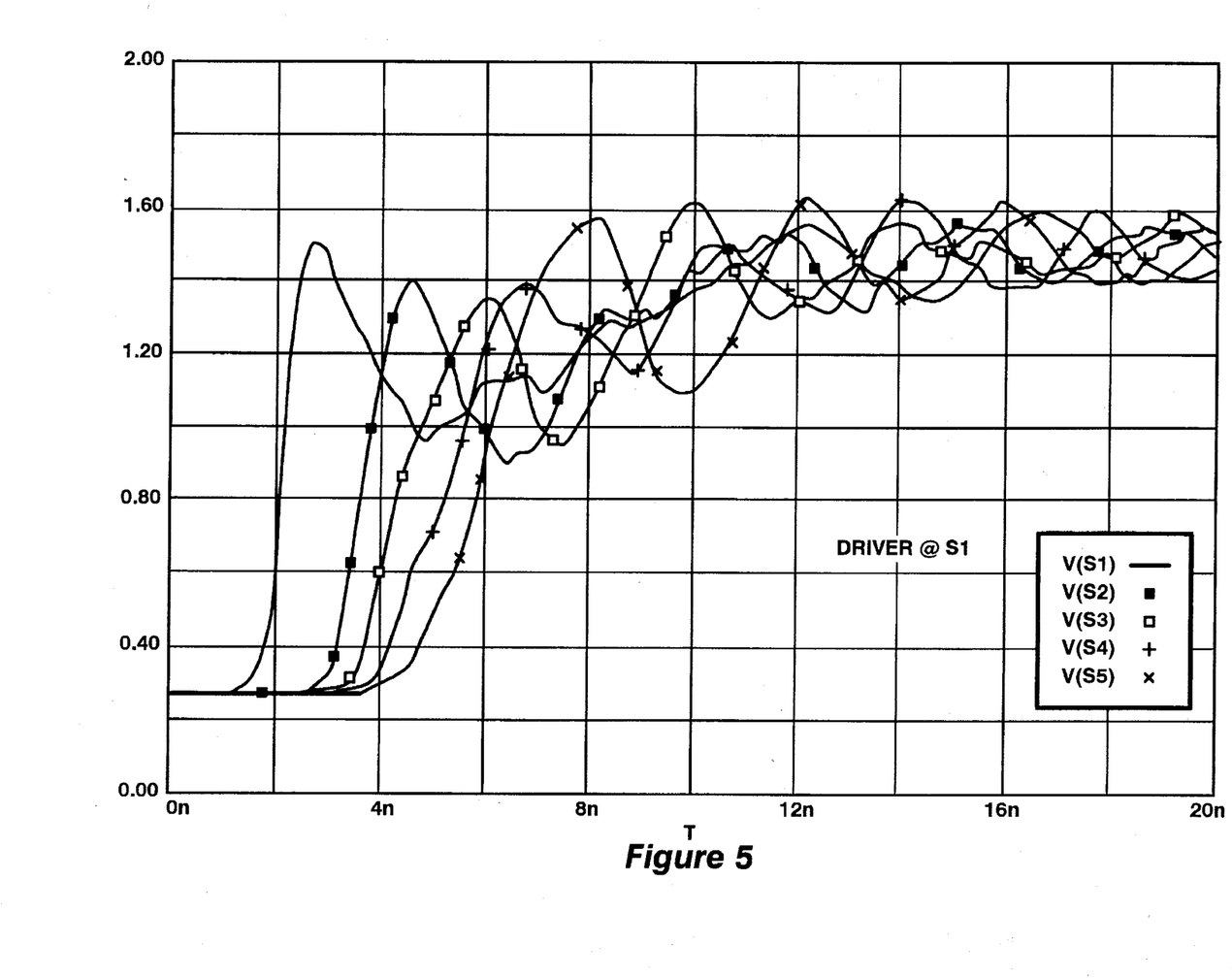
FIG. 5 depicts voltage waveforms at slots S1–S5 with the bus driver of FIG. 4A connected to slot S1.
Figure 6:
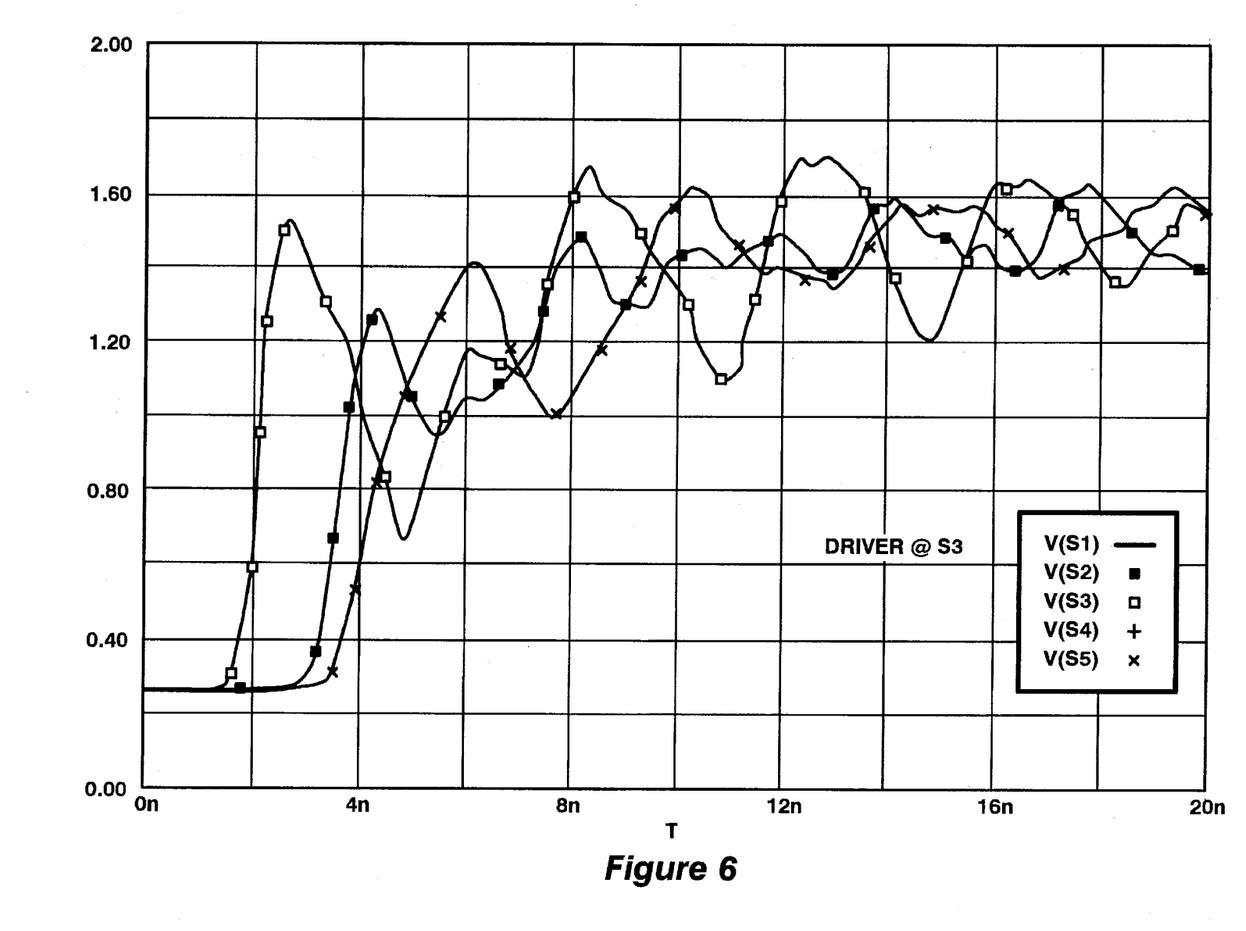
FIG. 6 depicts voltage waveforms at slots S1–S5 with the bus driver of FIG. 4A connected at slot S3.

Accordingly, a primary feature of the present invention is to provide a means for dynamically clamping the bus voltage for a predetermined period during a Low to High transition of the bus driver, thereby reducing the overshoot and ringing described above. The present invention achieves this goal by dynamically clamping the initial overshoot at approximately VT (as shown in FIGS. 5 and 6). The clamping is said to be "dynamic" in that it is active for only a limited, prescribed period. This limited period is adjustable as described hereinbelow. Preferably, each driver connected to the bus will have its own dynamic clamp. This arrangement provides a voltage clamp at each driver's output, and thus at each source of ringing.

One presently preferred embodiment of the invention comprises a driver (30) that receives an input signal (VIN) and provides an output signal (OUTPUT) to a bus (20) terminated with a terminating voltage (VT); and a clamp circuit (34) that receives a clamp gate signal (CLAMP GATE) and sinks current from the output signal (thus reducing ringing of the output signal and preventing or minimizing overshoot of the output signal above VT) during a period when the output signal is in a first prescribed state (e.g., HIGH) and the clamp gate signal (CLAMP GATE) is in a second prescribed state (e.g., HIGH). The clamp gate signal is preferably derived from a driver gate signal (DRIVER GATE) provided by the driver. In addition, this embodiment of the driver circuit includes a delay circuit (32) for disabling the clamp after a prescribed delay following a transition of the output signal (OUTPUT).

Other features and advantages of the present invention are disclosed below.

DETAILED DESCRIPTION OF PREFERRED EMBODIMENTS

Figure 4A:
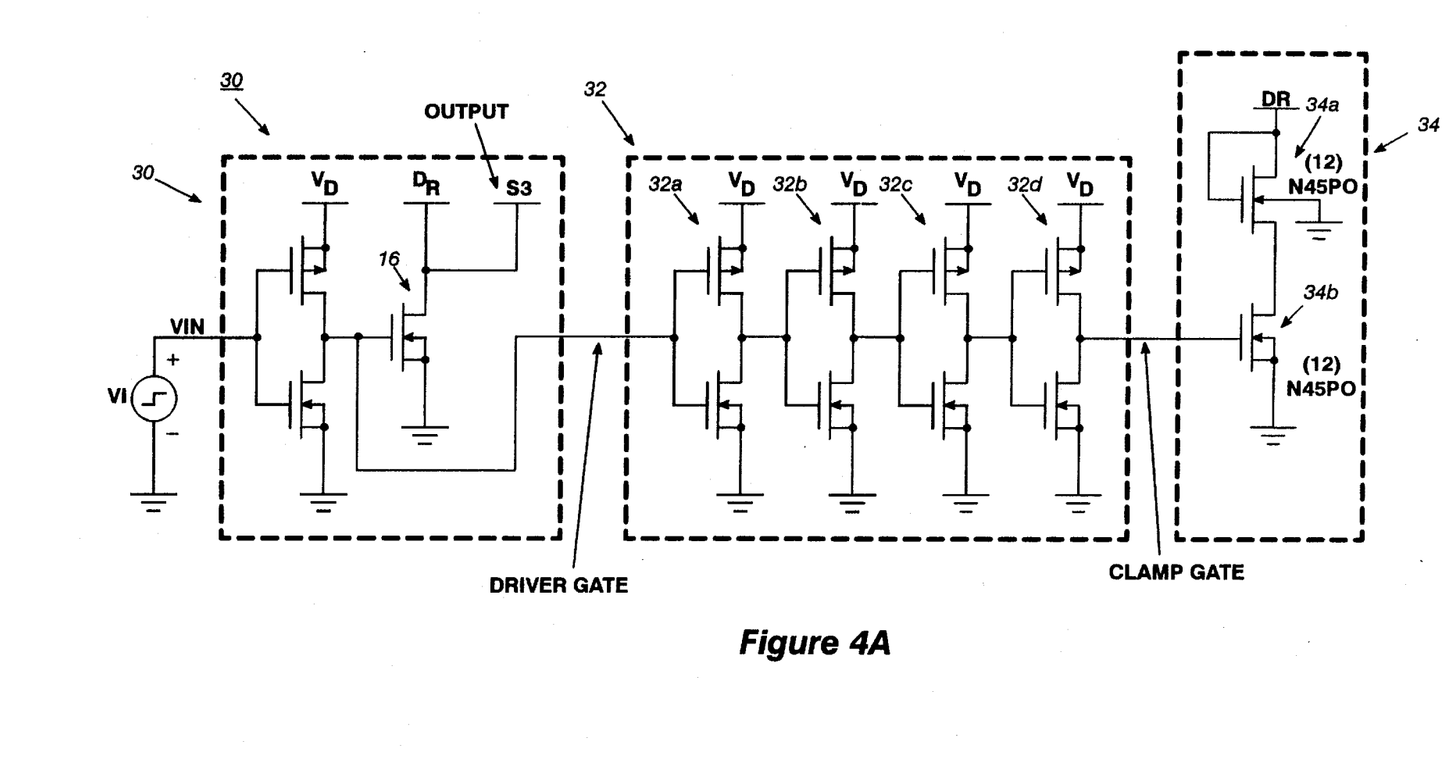
FIG. 4A depicts a preferred embodiment of a bus driver in accordance with the present invention.

FIG. 4A schematically depicts one presently preferred embodiment of a bus driver in accordance with the present invention. This embodiment includes a driver stage 30 similar to the prior art bus driver 10 depicted in FIG. 1A. Driver stage 30 receives an input voltage VIN from a pulse source and provides an output signal OUTPUT to a bus slot, in this case shown as slot S3. Like the prior art bus driver 10 of FIG. 1A, the driver 30 includes a pre-driver stage that receives the input voltage VIN and provides a driver gate signal (DRIVER GATE), which is also an inverted version of the output voltage (DATA OUT) at the open drain tie point DR of the plural NMOS devices (for example, twelve (12) parallel N45P0 devices).

In addition, a delay circuit 32 connected as shown to the gate of the driver stage receives as an input the DRIVER GATE signal. The delay circuit includes inverters 32a, 32b, 32c and 32d, which can be varied in number and size to achieve a prescribed period of delay, as required. With an even number of inverters, as in the example of FIG. 4A, the delay circuit 32 provides a CLAMP GATE signal that is identical to but a delayed version of the DRIVER GATE signal. This CLAMP GATE signal is provided to a clamp circuit 34. The clamp circuit 34 includes plural (in this example, twelve (12)) NMOS devices in parallel, as represented generally by device 34a, and a similar arrangement of plural NMOS devices as represented by device 34b. The gates of the parallel arrangement 34b receive the CLAMP GATE signal from the delay circuit 32, and provide a means for enabling the clamp circuit 34, as described below. The circuit of FIG. 4A was modeled and the waveforms of FIGS. 5 and 6 were computed by a circuit analysis program. The waveforms of FIGS. 5 and 6, when compared with those of FIGS. 2 and 3, dramatically demonstrate the improved performance of the bus driver circuit of FIG. 4A.

Figure 4B:
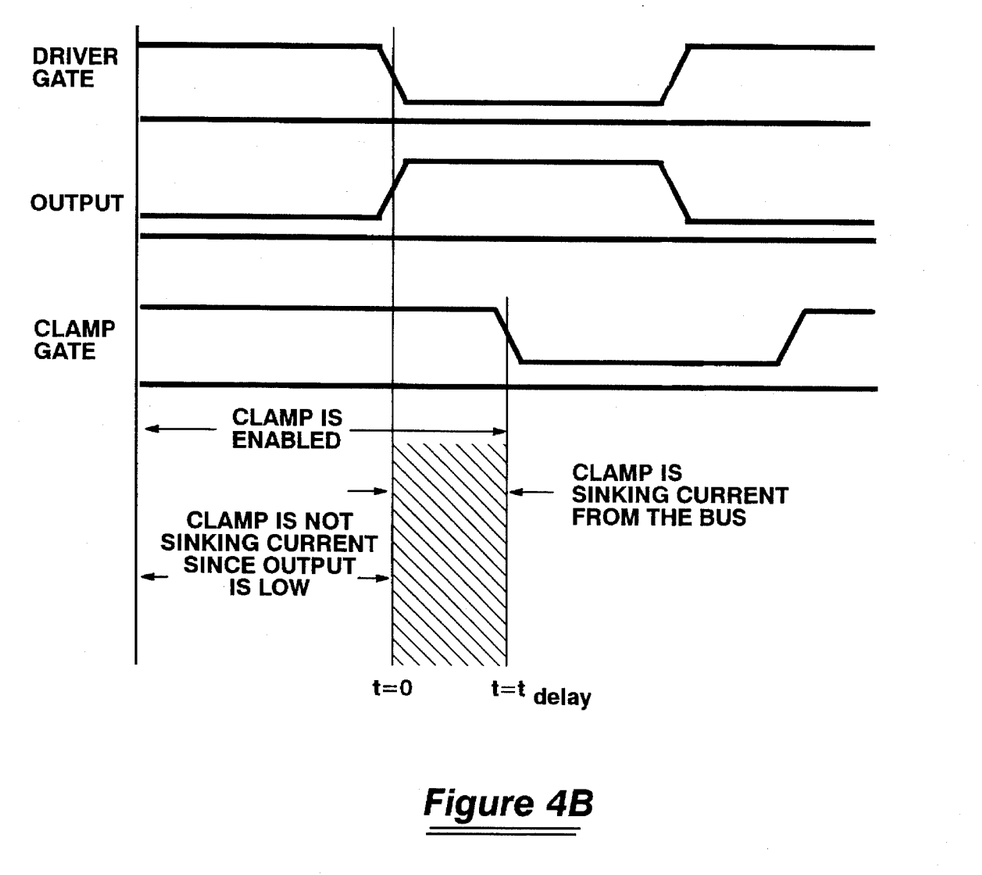
FIG. 4B depicts driver gate, output, and clamp gate waveforms, and is referred to below in describing the operation of the bus driver of FIG. 4A.
Figure 7:
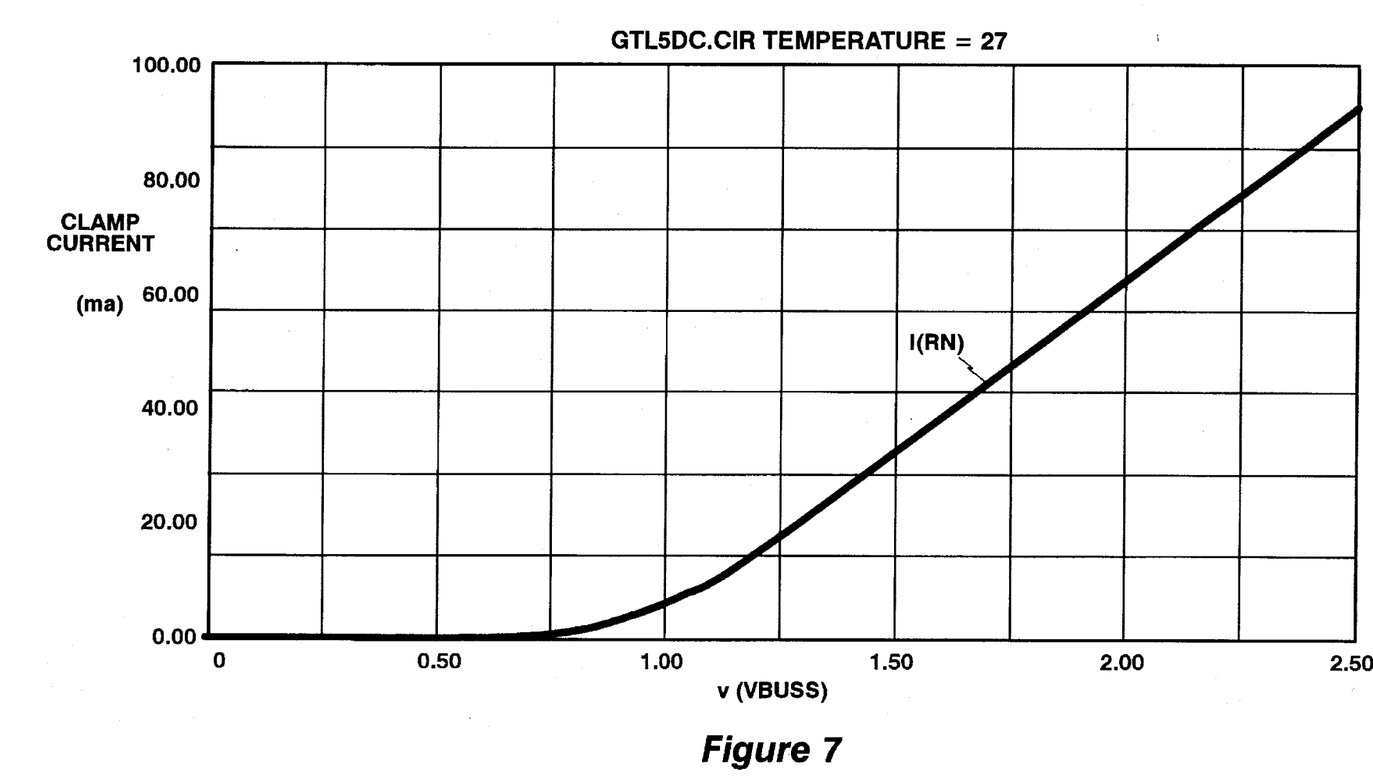
FIG. 7 depicts a DC characteristic of a clamp 34 employed in the embodiment of the invention depicted in FIG. 4A.

Referring to FIGS. 4A and 4B, the operation of the bus driver in accordance with the present invention will now be described. A HIGH transition of the OUTPUT signal results from a HIGH to LOW transition of the DRIVER GATE signal output by the pre-driver stage. Assume at time t=0 this HIGH to LOW transition occurs. Then, until t=$t_{delay}$, (the delay through the delay circuit 32), the gates of the parallel NMOS devices 34b (the CLAMP GATE signal) will be HIGH and thus enabled. The parallel arrangement 34a of NMOS devices, the gates of which are tied to their respective drains, will then start to conduct current when the bus voltage rises to approximately 0.75 V, as shown in FIG. 7. This is the DC characteristic of the clamp circuit 34. At time t=$t_{delay}$, the gates of the devices of the parallel arrangement 34b will go low, thus disabling the clamp circuit 34. In this example, $t_{delay}$ approximately 5 nS. At time t>$t_{delay}$, the clamp is removed from the bus and the bus voltage rises to VT in its natural response time.

In sum, the clamp is enabled during the period the CLAMP GATE signal is HIGH. However, the clamp sinks current from the bus only during the period during which both the OUTPUT signal and the CLAMP GATE signals are HIGH. The period of time during which the clamp sinks current from the bus can be adjusted by changing the delay provided by the delay circuit 32. In the embodiment of the delay circuit depicted in FIG. 4A, this can be accomplished by adding or subtracting inverters in multiples of 2 or changing their physical sizes.

Figure 8:
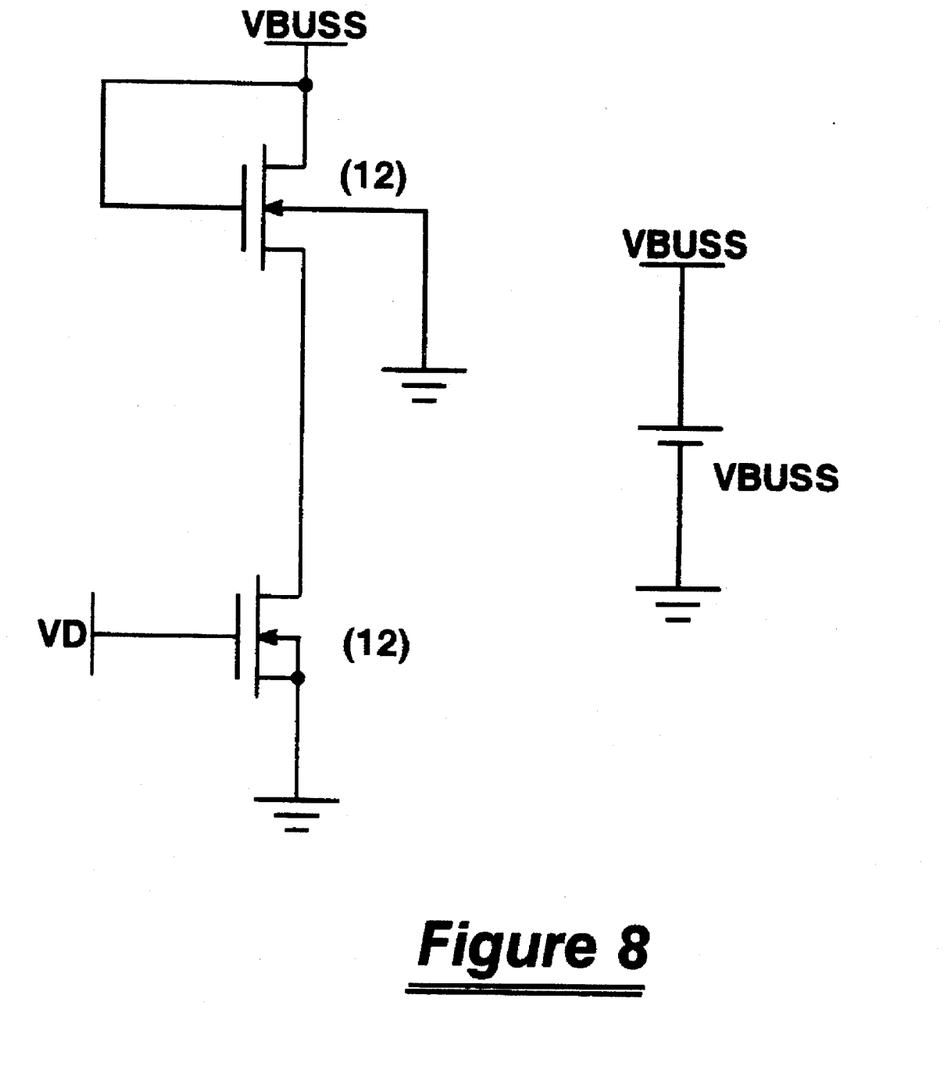
FIG. 8 depicts a model of the clamp 34 used in simulating the DC characteristic shown in FIG. 7.

The DC characteristic of FIG. 7 was computed using the model of FIG. 8.

Although one presently preferred embodiment of the invention is described above, those skilled in the art will recognize that various modifications and variations of this embodiment will fall within the true scope of the invention disclosed herein. For example, the delay circuit, presently an even number of inverters, could conceptually be implemented by using:

(a) a one-shot that, after receiving the DRIVER GATE signal, provides the CLAMP GATE signal, which would be High for t=$t_{delay}$;

(b) transmission gate(s) whose physical size and/or number set the delay.

In addition, the amount of overshoot of the output signal is dependent upon the physical size of the clamp and, to a lesser degree, the length of the stubs (TC). That is, if the number of NMOS devices forming 34a and 34b were reduced, then the amount of overshoot would increase. Likewise, if the length of the stubs were increased, the amount of overshoot would increase. Therefore, the physical size of the clamp may be designed such that for a specified maximum stub length the amount of overshoot is near zero.

Accordingly, the scope of protection of the following claims is intended not to be limited to the specific embodiment described above.

We claim:

1. A driver circuit comprising:
   (a) a driver having an input for receiving an input signal (VIN) and an output for providing an output signal (OUTPUT) to a bus terminated with a terminating voltage (VT); and
   (b) clamp means, coupled to said driver, for receiving a clamp gate signal (CLAMP GATE) and sinking current from said output signal during a period when said output signal is in a first prescribed state and said clamp gate signal is in a second prescribed state, whereby said clamp means dynamically reduces ringing of said output signal by substantially preventing overshoot of said output signal.

2. A driver circuit as recited in claim 1, wherein said clamp gate signal is derived from a driver gate signal (DRIVER GATE) provided by said driver.

3. A driver circuit as recited in claim 1 and further comprising:
(c) a delay circuit, coupled to said driver and said clamp means, for disabling said clamp means after a prescribed delay following a transition of said output signal (OUTPUT) to said first prescribed state.

4. A driver circuit as recited in claim 3, wherein said clamp gate signal is derived from a driver gate signal (DRIVER GATE) provided by said driver; and wherein said delay circuit receives and delays said driver gate signal, and provides said driver gate signal to said clamp means as said clamp gate signal.

5. A driver circuit as recited in claim 3, wherein said clamp means is disabled by inverting of said clamp gate signal.

6. A driver circuit comprising:
(a) a driver having an input for receiving an input signal (VIN) and an output for providing an output signal (OUTPUT) to a bus terminated with a terminating voltage (VT); and
(b) clamp means, coupled to said driver, for receiving a clamp gate signal (CLAMP GATE) and sinking current from said output signal during a period when said output signal is in a first prescribed state and said clamp gate signal is in a second prescribed state;
wherein said first and second prescribed states are HIGH.

7. A driver circuit comprising:
(a) a driver having an input for receiving an input signal (VIN) and an output for providing an output signal (OUTPUT) to a bus terminated with a terminating voltage (VT); and
(b) clamp means, coupled to said driver, for receiving a clamp gate signal (CLAMP GATE) and sinking current from said output signal during a period when said output signal is in a first prescribed state and said clamp gate signal is in a second prescribed state;
wherein said driver comprises a pre-driver stage; a driver stage comprising a plurality of parallel transistor devices having gates that receive a DRIVER GATE signal from the pre-driver stage and drains that provide a OUTPUT signal.

8. A driver circuit comprising:
(a) a driver having an input for receiving an input signal (VIN) and an output for providing an output signal (OUTPUT) to a bus terminated with a terminating voltage (VT); and
(b) clamp means, coupled to said driver, for receiving a clamp gate signal (CLAMP GATE) and sinking current from said output signal during a period when said output signal is in a first prescribed state and said clamp gate signal is in a second prescribed state;
wherein said clamp means comprises a first arrangement of plural parallel transistor devices having drain terminals and gates terminals tied to said drain terminals; and a second arrangement of plural parallel transistor devices having grounded source terminals, drain terminals connected to source terminals of the devices of said first arrangement, and gates that receive the CLAMP GATE signal to enable the clamp means.

9. A driver circuit comprising:
(a) a driver having an input for receiving an input signal (VIN) and an output for providing an output signal (OUTPUT) to a bus terminated with a terminating voltage (VT); and
(b) clamp means, coupled to said driver, for receiving a clamp gate signal (CLAMP GATE) and sinking current from said output signal during a period when said output signal is in a first prescribed state and said clamp gate signal is in a second prescribed state;
wherein said delay circuit comprises at least two inverters.

10. A driver circuit comprising:
(a) a driver having an input for receiving an input signal (VIN) and an output for providing an output signal (OUTPUT) to a bus terminated with a terminating voltage (VT);
(b) clamp means, coupled to said driver, for receiving a clamp gate signal (CLAMP GATE) and sinking current from said output signal during a period when said output signal is in a first prescribed state and said clamp gate signal is in a second prescribed state; and
a delay circuit, coupled to said driver and said clamp means, for disabling said clamp means after a prescribed delay following a transition of said output signal (OUTPUT) to said first prescribed state;
wherein said clamp gate signal is derived from a driver gate signal (DRIVER GATE) provided by said driver;
wherein said delay circuit receives and delays said driver gate signal, and provides said driver gate signal to said clamp means as said clamp gate signal;
wherein said driver comprises a pre-driver stage; a driver stage comprising a plurality of parallel transistor devices having gates that receive the DRIVER GATE signal from the pre-driver stage and drains that provide a OUTPUT signal;
wherein said clamp means comprises a first arrangement of plural parallel transistor devices having drain terminals and gates terminals tied to said drain terminals; and a second arrangement of plural parallel transistor devices having grounded source terminals, drain terminals connected to source terminals of the devices of said first arrangement, and gates that receive the CLAMP GATE signal to enable the clamp means; and
wherein said delay circuit comprises at least two inverters.

11. In a circuit for driving a bus terminated with a terminating voltage (VT), including a driver having an input for receiving an input signal (VIN) and an output for providing an output signal (OUTPUT) to the bus, an improvement comprising a clamp circuit for dynamically reducing ringing of said output signal by preventing overshoot of said output signal above a prescribed level during a period when said output signal (OUTPUT) and a clamp gate signal (CLAMP GATE) are in a prescribed state.

12. An improvement as recited in claim 11, and further comprising a delay circuit, coupled to said driver and said clamp circuit, for disabling said clamp circuit after a prescribed delay following a transition of said output signal (OUTPUT) to said prescribed state.

13. An improvement as recited in claim 12, wherein said clamp gate signal is derived from a driver gate signal (DRIVER GATE) provided by said driver; and wherein said delay circuit receives and delays said driver gate signal, and provides said driver gate signal to said clamp circuit as said clamp gate signal.

14. An improvement as recited in claim 13, wherein said clamp circuit is disabled by inverting of said clamp gate signal.

15. An improvement as recited in claim 14, wherein said prescribed state is HIGH.

16. An improvement as recited in claim 11, wherein said driver comprises a pre-driver stage; a driver stage comprising a plurality of parallel transistor devices having gates that receive a DRIVER GATE signal from the pre-driver stage and drains that provide a OUTPUT signal.

17. An improvement as recited in claim 11, wherein said clamp means comprises a first arrangement of plural parallel transistor devices having drain terminals and gates terminals tied to said drain terminals; and a second arrangement of plural parallel transistor devices having grounded source terminals, drain terminals connected to source terminals of the devices of said first arrangement, and gates that receive the CLAMP GATE signal to enable the clamp means.

18. An improvement as recited in claim 12, wherein said delay circuit comprises at least two inverters.

19. A method for driving a bus terminated with a terminating voltage (VT), comprising dynamically reducing ringing of a bus driver output signal by preventing overshoot of said output signal above a prescribed level during a period when said output signal (OUTPUT) and a clamp gate signal (CLAMP GATE) are in a prescribed state.

20. A method as recited in claim 19, wherein said step of preventing overshoot of said output signal is performed with a clamp circuit, and further comprising the step of disabling said clamp circuit after a prescribed delay following a transition of said output signal (OUTPUT) to said prescribed state.

* * * * *